US 12,424,447 B2

(12) United States Patent
Tsai et al.

(10) Patent No.: US 12,424,447 B2
(45) Date of Patent: Sep. 23, 2025

(54) METHOD TO SELECTIVELY ETCH SILICON NITRIDE TO SILICON OXIDE USING WATER CRYSTALLIZATION

(71) Applicant: Tokyo Electron Limited, Tokyo (JP)

(72) Inventors: Yu-Hao Tsai, Albany, NY (US); Mingmei Wang, Fremont, CA (US); Du Zhang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 462 days.

(21) Appl. No.: 17/967,996

(22) Filed: Oct. 18, 2022

(65) Prior Publication Data
US 2024/0128089 A1 Apr. 18, 2024

(51) Int. Cl.
*H01L 21/308* (2006.01)
(52) U.S. Cl.
CPC ...... *H01L 21/3081* (2013.01); *H01L 21/3086* (2013.01)
(58) Field of Classification Search
None
See application file for complete search history.

(56) References Cited

U.S. PATENT DOCUMENTS

| 8,501,630 | B2 | 8/2013 | Metz et al. |
| 8,617,348 | B1 | 12/2013 | Liu et al. |
| 9,899,515 | B1 | 2/2018 | Cheng et al. |
| 10,600,660 | B2 | 3/2020 | Tabata et al. |
| 10,818,507 | B2 | 10/2020 | Sherpa et al. |
| 2006/0292883 | A1 | 12/2006 | Tsai |
| 2018/0076083 | A1 | 3/2018 | Ko et al. |

(Continued)

FOREIGN PATENT DOCUMENTS

| EP | 0869545 | 10/1998 |
| EP | 3038142 | 6/2016 |

(Continued)

OTHER PUBLICATIONS

Notification of Transmittal of the International Search Report and the Written Opinion of the International Searching Authority, or the Declaration, Filing Date Sep. 6, 2023, PCT/US2023/032042; Dec. 20, 2023, 8 pgs.

(Continued)

*Primary Examiner* — Stephanie P Duclair
(74) *Attorney, Agent, or Firm* — Egan, Enders & Huston LLP.

(57) ABSTRACT

Embodiments of improved processes and methods that provide selective etching of silicon nitride are disclosed herein. More specifically, a cyclic, two-step dry etch process is provided to selectively etch silicon nitride layers formed on a substrate, while protecting oxide layers formed on the same substrate. The cyclic, two-step dry etch process sequentially exposes the substrate to: (1) a hydrogen plasma to modify exposed surfaces of the silicon nitride layer and the oxide layer to form a modified silicon nitride surface layer and a modified oxide surface layer, and (2) a halogen plasma to selectively etch silicon nitride by removing the modified silicon nitride surface layer without removing the modified oxide surface layer. The oxide layer is protected from etching during the removal step (i.e., step 2) by creating a crystallized water layer on the oxide layer during the surface modification step (i.e., step 1).

19 Claims, 6 Drawing Sheets

(56) References Cited

U.S. PATENT DOCUMENTS

| | | |
|---|---|---|
| 2018/0138049 A1 | 5/2018 | Ko et al. |
| 2018/0166303 A1 | 6/2018 | Tabata et al. |
| 2018/0269070 A1 | 9/2018 | Eason et al. |
| 2018/0315614 A1 | 11/2018 | Posseme |
| 2018/0350617 A1 | 12/2018 | Chen et al. |
| 2019/0165099 A1 | 5/2019 | Chen et al. |
| 2020/0013632 A1* | 1/2020 | Chen .................... H10D 64/015 |
| 2020/0027740 A1 | 1/2020 | Vervuurt et al. |
| 2020/0185238 A1* | 6/2020 | Tabata .............. H01J 37/32174 |
| 2022/0089951 A1 | 3/2022 | Kim et al. |

FOREIGN PATENT DOCUMENTS

| | | |
|---|---|---|
| WO | 2015099789 | 7/2015 |
| WO | 2020160437 | 8/2020 |

OTHER PUBLICATIONS

Lee et al., "Selective Etching of Silicon Nitride Over Silicon Oxide Using ClF3/H2 Remote Plasma", Scientific Reports, 2022, 9 pgs.

Sherpa et al., "Quasi-atomic Layer Etching of Silicon Nitride, Journal of Vacuum Science & Technology a Vacuum Surfaces and Films", Jan. 2017, 8 pgs.

* cited by examiner

METHOD TO SELECTIVELY ETCH SILICON NITRIDE TO SILICON OXIDE USING WATER CRYSTALLIZATION

BACKGROUND

The present disclosure relates to processing of substrates, and in particular, to methods to etch material layers on a semiconductor substrate.

Semiconductor device formation typically involves a series of manufacturing techniques related to the formation, patterning, and removal of a number of layers of material on a substrate. During routine semiconductor fabrication, various materials formed on a substrate may be removed by patterned etching, chemical-mechanical polishing, as well as other techniques. A variety of techniques are known for etching layers on a substrate, including plasma-based or vapor-phase etching (otherwise referred to as dry etching) and liquid based etching (otherwise referred to as wet etching). As the semiconductor device size is decreased to sub-nanoscale, and device integration is changed from two dimensional to three dimensional structures, more precise and selective etch technology is required for semiconductor device fabrication.

Silicon nitride (SiN) is used in a wide variety of semiconductor devices as a barrier layer for dopant diffusion, a gate sidewall spacer layer, a buffer layer, a liner layer, an etch stop layer, etc. due to its high insulating characteristics, high thermal and mechanical stability, etc. Because SiN layers are commonly formed on substrates having silicon (Si) and/or silicon oxide ($SiO_2$) layers disposed thereon, selective etching of silicon nitride over silicon and/or silicon oxide is important for various microelectronic applications.

For example, fabrication of nanosheet FETs (field effect transistors) typically require the removal of silicon nitride spacers with etch processes that are selective to silicon channel regions that are encapsulated by the silicon nitride spacers. Likewise, a contact etch stop layer (CESL) on epitaxial semiconductor material (epi) fins and/or along a gate sidewall is typically required to be removed with a highly selective etch. For example, a loss of less than 3 nanometers (nm) of material from epi fins is often required. In addition, removal of CESL residues from valleys situated between epi diamond structures can be a significant challenge for certain process flows. Other semiconductor fabrication processes can also have requirements for highly selective removal of silicon nitride layers in order to achieve desired results.

A variety of techniques have been used to etch silicon nitride. For example, fluorocarbon (e.g., $C_xF_z$-based), hydrofluorocarbon (e.g., $C_xH_yF_z$-based) and other fluorine (e.g., $NF_x$-based) etch chemistries have been used to etch silicon nitride selective to oxide, silicon and other materials. For example, $C_xH_yF_z/O_2/H_2$ plasmas have been used to create thicker depositions on SiN and $CF_4/O_2/N_2$ plasmas have been used to enhance nitrogen elimination in SiN layers. However, it is difficult to fine tune the deposition layer thickness and oxide layers are still etched during this etch process. Moreover, fluorocarbon ($C_xF_z$) etch gases are often undesirable due to contamination issues by carbon or deposition of $CF_x$ ($CH_x$) polymers on the surface of the film, which is a detrimental factor for device fabrication.

Other techniques have used a two-step approach—surface modification followed by removal of the modified surface layers—to selectively etch silicon nitride. For example, one two-step process for the selective etch of silicon nitride uses a hydrogen plasma to modify exposed SiN surfaces and a dilute hydrofluoric acid (dHF) wet etch to remove the modified surface layer. This two-step process uses a dry etch technique for surface modification and a wet etch technique for removal of the modified surface layer, and as such, cannot be implemented as a cyclical process. Another two-step process used to selectively etch silicon nitride in a cyclic dry etch process uses a hydrogen plasma to modify exposed SiN surfaces and a fluorinated plasma to remove the modified surface layer. This two-step dry etch process is typically performed in a plasma processing chamber (e.g., an inductively coupled plasma, ICP, or capacitively coupled, CCP, process chamber) at relatively low pressure (e.g., 10-100 mTorr) and moderate to high temperature (e.g., 10° C.-100° C.) to selectively etch SiN in a cyclic process.

Although selective etch processes for silicon nitride are known, the etch selectivity of silicon nitride (SiN) over oxide (e.g., $SiO_2$) needs further improvement in current semiconductor fabrication processes. A highly selective etch of silicon nitride to oxide is critical in many semiconductor fabrication processes. As such, improved techniques are needed to protect oxide layers (as well as structures below such oxide layers) from over-etch when etching SiN on a substrate having both SiN and oxide layers formed thereon.

SUMMARY

Embodiments of improved processes and methods that provide selective etching of silicon nitride are disclosed herein. In the disclosed embodiments, a cyclic, two-step dry etch process is used to selectively etch silicon nitride layers formed on a substrate, while protecting oxide layers formed on the same substrate. The cyclic, two-step dry etch process disclosed herein sequentially exposes the substrate to: (1) a hydrogen plasma to modify exposed surfaces of the silicon nitride layer and the oxide layer to form a modified silicon nitride surface layer and a modified oxide surface layer, and (2) a halogen plasma to selectively etch silicon nitride by removing the modified silicon nitride surface layer without removing the modified oxide surface layer. The oxide layer is protected from etching during the removal step (i.e., step 2) by creating a crystallized water layer on the oxide layer during the surface modification step (i.e., step 1). The crystallized water layer improves selectivity of silicon nitride to oxide by providing a protective layer on the oxide layer, which prevents reactive species of the halogen plasma from reaching the modified oxide surface layer. The process gas(es) used to generate the halogen plasma may further reduce (or eliminate) etching of the oxide layer by providing a highly selective etch of the modified silicon nitride surface layer to the modified oxide surface layer.

The embodiments disclosed herein create a protective water layer on the oxide layer by leveraging the different volatilities of reaction byproducts produced during the surface modification step (i.e., step 1). For example, when the substrate is exposed to the hydrogen plasma, hydrogen ions within the hydrogen plasma: (a) react with exposed surface of the silicon nitride layer to form a first reaction byproduct (e.g., ammonia, $NH_3$), and (b) react with exposed surfaces of the oxide layer to form a second reaction byproduct (e.g., water, $H_2O$). By selecting the appropriate pressure and temperature conditions, the embodiments disclosed herein may vaporize the first reaction byproduct, leaving a silicon (Si) surface layer on the SiN layer, and freeze the second reaction byproduct, leaving a crystallized water layer on the oxide layer. Since the oxide layer is protected by the crystallized water layer, the halogen plasma will selectively etch the SiN layer during the subsequently performed removal step (i.e., step 2).

According to one embodiment, a method is provided herein of selectively etching silicon nitride over oxide in accordance with the present disclosure. In some embodiments, the method may include providing a substrate having a silicon nitride layer and an oxide layer exposed on a surface of the substrate, and exposing the surface of the substrate to a hydrogen plasma to: (a) modify an exposed surface of the silicon nitride layer to form a first modified layer, and (b) modify an exposed surface of the oxide layer to form a second modified layer. A gas pressure used to generate the hydrogen plasma and a temperature of the substrate create a crystallized water layer, which bonds with the oxide layer to form the second modified layer. Next, the method may include exposing the surface of the substrate to a halogen plasma to selectively etch the silicon nitride layer by removing the first modified layer without removing the second modified layer, and repeating said exposing the surface of the substrate to the hydrogen plasma and said exposing the surface of the substrate to the halogen plasma one or more times until a predetermined amount of the silicon nitride layer is selectively etched.

A wide variety of gas pressures and substrate temperatures may be used in the method described above. For example, the gas pressure may range between 10 mTorr and 1500 Torr and the substrate temperature may range between 20° C. and −150° C., in some embodiments. In other embodiments, the gas pressure may range between 10 mTorr and 100 Torr and the substrate temperature may range between 0° C. and −80° C.

During said exposing the surface of the substrate to the hydrogen plasma, the hydrogen plasma may react with the exposed surface of the silicon nitride layer to form a first reaction byproduct, which is vaporized at the gas pressure and the temperature of the substrate to form the first modified layer. For example, the first reaction byproduct may be ammonia ($NH_3$) and the first modified layer may be a silicon layer.

During said exposing the surface of the substrate to the hydrogen plasma, the hydrogen plasma may also react with the exposed surface of the oxide layer to produce a second reaction byproduct, which freezes at the gas pressure and the temperature of the substrate to create the crystallized water layer on the oxide layer and form the second modified layer. For example, the second reaction byproduct may be water ($H_2O$) and the second modified layer may be a silicon dioxide layer.

During said exposing the surface of the substrate to the halogen plasma, the crystallized water layer may reduce etching of the oxide layer by preventing reactive species of the halogen plasma from reaching the second modified layer. In some embodiments, the first modified layer may be a silicon layer and the second modified layer may be a silicon dioxide layer. In such embodiments, the reactive species of the halogen plasma may selectively etch silicon over silicon dioxide to further reduce or eliminate etching of the oxide layer. In some embodiments, the method may further include generating the halogen plasma from one or more process gases, which have an etch selectivity of silicon to silicon dioxide of 5:1 or greater. For example, the one or more processing gases used to generate the halogen plasma may include one or more of chlorine ($Cl_2$), hydrogen bromide (HBr), difluoride ($F_2$), xenon difluoride (XeF2), tetrafluoromethane ($CF_4$), nitrogen trifluoride ($NF_3$) and sulfur hexafluoride ($SF_6$).

According to another embodiment, another method is provided herein of selectively etching silicon nitride over oxide in accordance with the present disclosure. In some embodiments, the method may include providing a substrate having a silicon nitride layer and an oxide layer exposed on a surface of the substrate, generating a hydrogen plasma at a gas pressure less than 1500 Torr and a temperature of the substrate less than or equal to 0° C. and exposing the surface of the substrate to the hydrogen plasma. When exposed to the hydrogen plasma, the hydrogen plasma may: (a) react with an exposed surface of the silicon nitride layer to form a first reaction byproduct, which is vaporized at the gas pressure and the temperature of the substrate to form a first modified layer on the silicon nitride layer, and (b) react with an exposed surface of the oxide layer to produce a second reaction byproduct, which freezes at the gas pressure and the temperature of the substrate to create a crystallized water layer and form a second modified layer on the oxide layer. The method may further include exposing the surface of the substrate to a halogen plasma to selectively etch the silicon nitride layer by removing the first modified layer without removing the second modified layer. In some embodiments, the method may further include repeating said exposing the surface of the substrate to the hydrogen plasma and said exposing the surface of the substrate to the halogen plasma a number of cycles to selectively etch a predetermined amount of the silicon nitride layer.

As noted above, a wide variety of gas pressures and substrate temperatures may be used in the method described above. In some embodiments, the gas pressure may range between 10 mTorr and 1500 Torr and the substrate temperature may range between 0° C. and −80° C.

During said exposing the surface of the substrate to the halogen plasma, the crystallized water layer may reduce etching of the oxide layer by preventing reactive species of the halogen plasma from reaching the second modified layer. In some embodiments, the first modified layer may be a silicon layer and the second modified layer may be a silicon dioxide layer. In such embodiments, the reactive species of the halogen plasma may selectively etch silicon over silicon dioxide to further reduce or eliminate etching of the oxide layer. In some embodiments, the halogen plasma may be generated from one or more process gases, which have an etch selectivity of silicon to silicon dioxide of 5:1 or greater.

A wide variety of process gases may be used to generate the hydrogen plasma and the halogen plasma described herein. For example, the hydrogen plasma may be generated from one or more process gases including, but not limited to, hydrogen ($H_2$), hydrogen bromide (HBr), methane ($CH_4$) and hydrogen sulfide ($H_2S$). The halogen plasma may be generated from one or more process gases including, but not limited to, chlorine ($Cl_2$), hydrogen bromide (HBr), difluoride ($F_2$), xenon difluoride (XeF2), tetrafluoromethane ($CF_4$), nitrogen trifluoride ($NF_3$) and sulfur hexafluoride ($SF_6$).

In some embodiments, the first reaction byproduct may be ammonia ($NH_3$), the first modified layer may be a silicon layer, the second reaction byproduct may be water ($H_2O$) and the second modified layer may be a silicon dioxide layer. When the surface of the substrate is exposed to the hydrogen plasma, the gas pressure used to generate the hydrogen plasma and the temperature of the substrate may: (a) vaporize the ammonia ($NH_3$) from the exposed surface of the silicon nitride layer to form the silicon layer, and (b) freeze the water ($H_2O$) on the exposed surface of the oxide layer to create the crystallized water layer, which bonds with the exposed surface of the oxide layer to form the silicon dioxide layer. As noted above, the gas pressure used to generate the hydrogen plasma and the temperature of the substrate may be selected from a pressure-temperature window comprising a pressure range between 10 mTorr and 1500 Torr and a temperature range between 0° C. and −80° C.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides various embodiments of improved processes and methods to provide selective etching of silicon nitride over oxide. In the disclosed embodiments, a cyclic, two-step dry etch process is used to selectively etch a silicon nitride layer formed on a substrate, while protecting an oxide layer formed on the same substrate. As noted above, the cyclic, two-step dry etch process disclosed herein sequentially exposes the substrate to: (1) a hydrogen plasma to modify exposed surfaces of the silicon nitride and oxide layers to form a modified silicon nitride surface layer and a modified oxide surface layer, and (2) a halogen plasma to selectively etch the silicon nitride layer by removing the modified silicon nitride surface layer without removing the modified oxide surface layer. The oxide layer is protected from etching during the removal step (i.e., step 2) by creating a crystallized water layer on the oxide layer during the surface modification step (i.e., step 1). The crystallized water layer improves selectivity of silicon nitride to oxide by providing a protective layer on the oxide layer, which prevents reactive species of the halogen plasma from reaching the modified oxide surface layer. The process gas(es) used to generate the halogen plasma may further reduce (or eliminate) etching of the oxide layer by providing a highly selective etch of the modified silicon nitride surface layer to the modified oxide surface layer.

As described in more detail below, the embodiments disclosed herein create a protective water layer on the oxide layer by leveraging the different volatilities of reaction byproducts produced during the surface modification step (i.e., step 1). For example, when the substrate is exposed to the hydrogen plasma in the surface modification step, hydrogen ions within the hydrogen plasma: (a) react with exposed SiN surfaces to form a first reaction byproduct (e.g., ammonia, $NH_3$), and (b) react with exposed oxide surfaces to form a second reaction byproduct (e.g., water, $H_2O$). During the surface modification step, pressure and temperature conditions are carefully selected, so as to vaporize $NH_3$ leaving a silicon (Si) surface layer on the SiN layer, and freeze $H_2O$ leaving a crystallized water layer on the oxide layer. The crystallized water layer protects the oxide layer during the subsequently performed removal step (i.e., step 2), thereby providing a two-step dry etch process that etches SiN over oxide with high etch selectivity. Since dry etch processes are utilized for both surface modification and removal, the two-step process described herein may be repeated in a cyclical manner to selectively etch a predetermined amount of SiN without significantly etching oxide.

Figure 1:
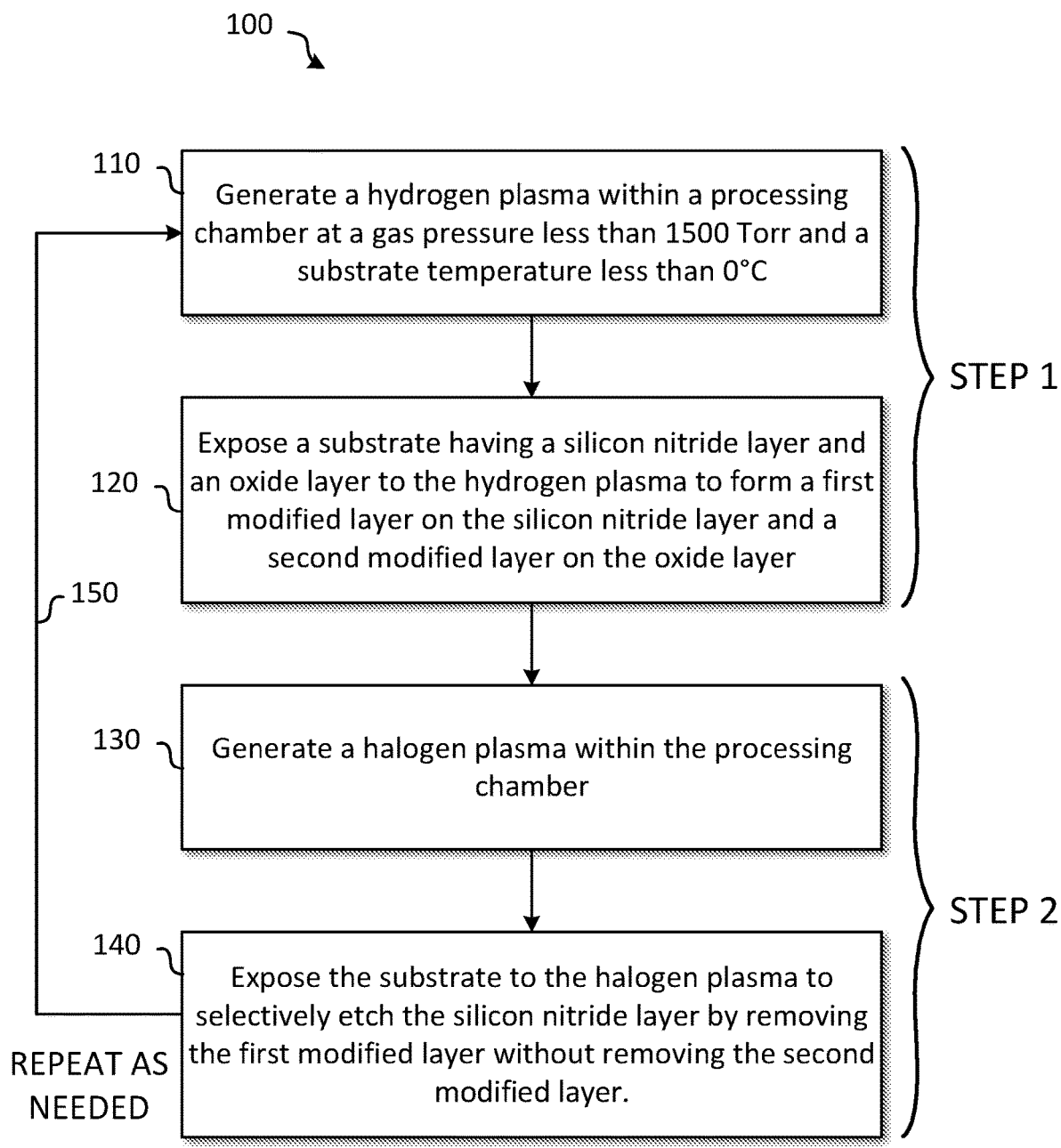
FIG. 1 is a process flow diagram of an example embodiment of a cyclic, two-step dry etch process that utilizes sequential application of plasma etch steps, including a hydrogen plasma (in Step 1) followed by a halogen plasma (in Step 2), to selectively etch silicon nitride over oxide.

FIG. 1 is a process flow diagram of an example embodiment of a cyclic, two-step dry etch process 100 that may be used to selectively etch silicon nitride over oxide in accordance with the techniques described herein. The cyclic, two-step dry etch process 100 shown in FIG. 1 may be used to selectively etch silicon nitride layers formed on the substrate, while protecting oxide layers formed on the same substrate. The dry etch process shown in FIG. 1 may be performed on a wide variety of substrates, which may be disposed within a wide variety of plasma processing systems. Examples of plasma processing systems used to perform the dry etch process shown in FIG. 1 include, but are not limited to, a capacitively coupled plasma (CCP) processing system, an inductively coupled plasma (ICP) processing system, a microwave plasma processing system, a Radial Line Slot Antenna (RLSA™) microwave plasma processing system, an electron cyclotron resonance (ECR) plasma processing system, or other type of processing system or combination of systems.

The dry etch process 100 shown in FIG. 1 is cyclic, two-step process that generally includes a surface modification step (Step 1) followed by a removal step (Step 2). During the surface modification step (Step 1), the dry etch process 100 generates a hydrogen plasma within the plasma processing chamber at a gas pressure less than 1500 Torr and a substrate temperature less than 0° C. (in block 110), and exposes a substrate having a silicon nitride (SiN) layer and an oxide (Ox) layer (e.g., $SiO_2$) formed thereon to the hydrogen plasma to form a first modified layer on the SiN layer and a second modified layer on the oxide layer (in block 120). When the substrate is exposed to the hydrogen plasma (in block 120), hydrogen ions within the hydrogen plasma: (a) react with exposed SiN surfaces to remove nitrogen (N) atoms from the exposed SiN surfaces, and (b) react with exposed oxide surfaces to remove oxygen (O) atoms from the exposed oxide surfaces. This reaction modifies the exposed SiN surfaces and the exposed oxide surfaces, leaving a first modified layer (e.g., a silicon layer) on the unmodified SiN layer and a second modified layer (e.g., an O-defected silicon dioxide layer) on the unmodified oxide layer.

During the removal step (Step 2), the dry etch process 100 generates a halogen plasma within the plasma processing chamber (in block 130), and exposes the substrate to the halogen plasma (in block 140) to selectively etch the silicon nitride layer by removing the first modified layer without removing the second modified layer. When the substrate is exposed to the halogen plasma (in block 140), the first modified layer is etched at a significantly higher etch rate than the second modified layer to selectively etch the modified portions of the silicon nitride layer. Once the modified portions of the silicon nitride layer are removed, the surface modification step (Step 1) and the removal step (Step 2) may be repeated, as indicated by arrow 150, to remove a desired amount of silicon nitride from the substrate.

Figure 2:
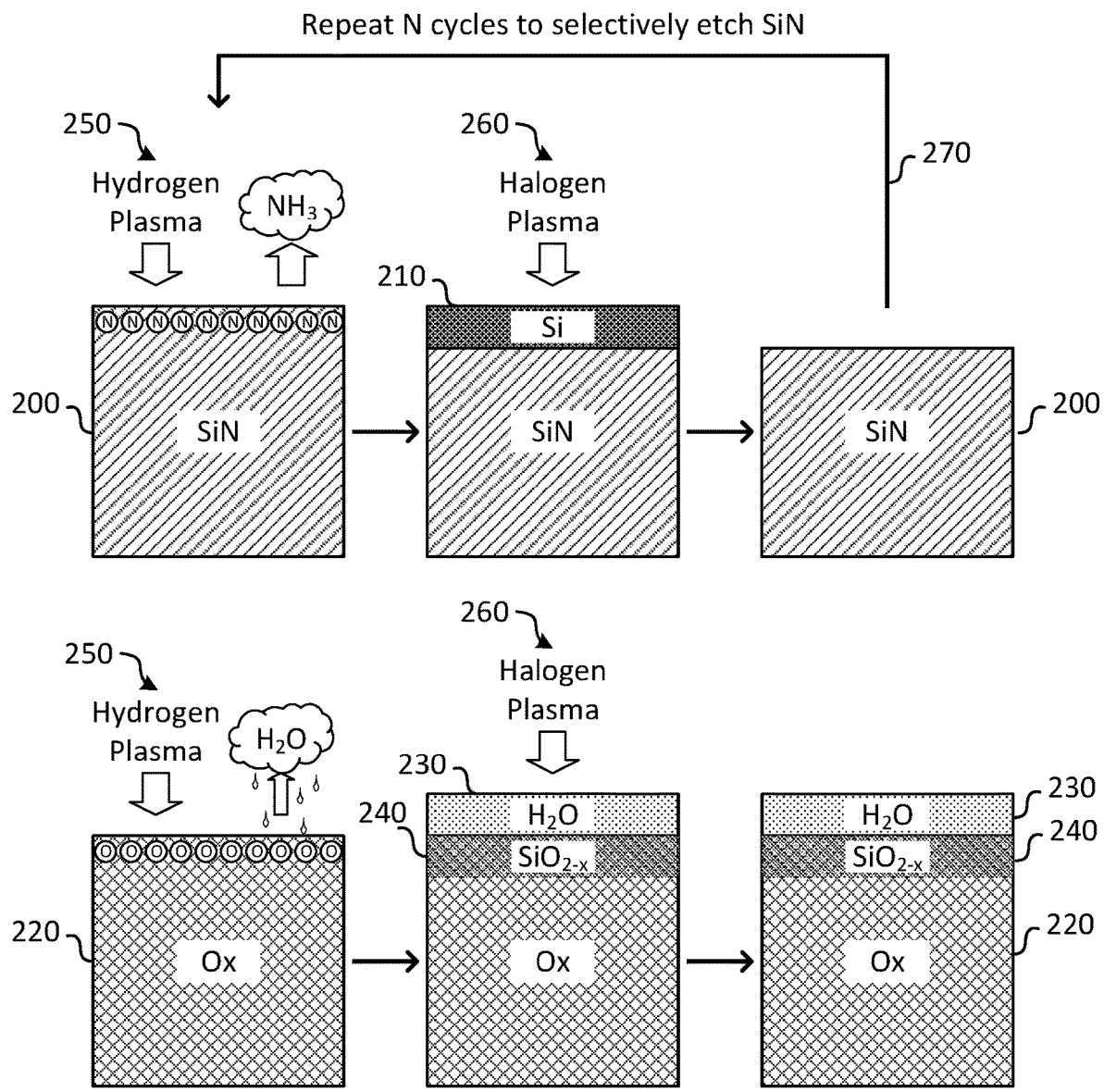
FIG. 2 is a process flow diagram of an example embodiment of a cyclic, two-step dry etch process, which uses: (1) a hydrogen plasma to modify exposed surfaces of silicon nitride and oxide layers to form a modified silicon nitride surface layer and a modified oxide surface layer, and (2) a halogen plasma to selectively etch the silicon nitride layer by removing the modified silicon nitride surface layer without removing the modified oxide surface layer.

FIG. 2 illustrates the surface modification step (Step 1) and the removal step (Step 2) in more detail. When a substrate comprising a SiN layer 200 and an oxide (Ox) layer 220 (e.g., $SiO_2$) is exposed to a hydrogen plasma 250 during the surface modification step (Step 1), hydrogen ions within the hydrogen plasma 250 react with nitrogen (N) atoms on the exposed surfaces of the SiN layer 200 to produce a first reaction byproduct (e.g., ammonia, $NH_3$), which is vaporized at the gas pressure within the plasma processing chamber and the substrate temperature to form a silicon (Si) layer 210 (i.e., a first modified layer) on the underlying, unmodified portions of the SiN layer 200. The hydrogen ions within the hydrogen plasma 250 also react with oxygen (O) atoms on exposed surfaces of the oxide (Ox) layer 220 to produce a second reaction byproduct (e.g., water, $H_2O$), which condenses and freezes at the gas pressure within the plasma processing chamber and the substrate temperature to create a crystallized water layer 230 on the oxide layer 220. The crystallized water layer 230 forms an O-defected silicon dioxide ($SiO_2$-x) layer 240 (i.e., a second modified layer) on the underlying, unmodified oxide layer 220, instead of a Si layer, through the formation of Si—O bonds.

When the substrate is exposed to a halogen plasma 260 during the removal step (Step 2), the crystallized water layer 230 protects the oxide layer 220 from etching by preventing reactive species of the halogen plasma 260 from reaching the O-defected silicon dioxide ($SiO_2$-x) layer 240 (i.e., a second modified layer) and the underlying, unmodified oxide layer 220. In addition, the process gas(es) used to generate the halogen plasma 260 may further reduce (or eliminate) etching of the oxide layer 220 by providing high etch selectivity of the Si layer 210 (i.e., the first modified layer) to the O-defected silicon dioxide ($SiO_2$-x) layer 240 (i.e., the second modified layer). For example, the process gas(es) used to generate the halogen plasma 260 may provide an etch selectivity of Si to $SiO_2$ of 5:1, or more preferably, 10:1 or greater. Although a wide variety of halogen-containing gases can be used in the removal step (Step 2), examples of process gas(es) providing high etch selectivity of Si to $SiO_2$ may include, but are not limited to, hydrogen bromide (HBr), chlorine ($Cl_2$), difluoride ($F_2$), xenon difluoride (XeF2) and other halogen-containing process gases. This enables the Si layer 210 to be etched at a significantly higher etch rate than the O-defected silicon dioxide ($SiO_2$-x) layer 240 during the removal step (Step 2).

After the Si layer 210 is removed to selectively etch the SiN layer 200, the surface modification step (Step 1) and the removal step (Step 2) can be repeated one or more cycles (as needed) to remove a desired amount of SiN from the substrate, as indicated by arrow 270. In embodiments, the surface modification step (Step 1) and the removal step (Step 2) can be repeated N cycles (where N ranges between 1 and 100) to remove a predetermined amount of the SiN layer 200, as shown for example, in FIG. 2.

The dry etch process 100 provides one example of an improved process that may be used to selectively etch silicon nitride over oxide. As described above with respect to FIGS. 1-2, dry etch process 100 utilizes sequential surface modification and removal steps to selectively etch a silicon nitride layer on a substrate, without etching an oxide layer on the same substrate. It is noted that the silicon nitride layer can be implemented as silicon nitride (SiN), or as a silicon nitride material that includes SiN along with one or more other elements. In one example, the silicon nitride layer may be a Silicon Carbonitride/Boron Nitride (SiBCN) spacer. Other silicon nitride materials may also be selectively etched using the dry etch process 100 shown in FIGS. 1 and 2.

In addition to providing high selectively of silicon nitride to oxide, the dry etch process 100 can be repeated a number of times to etch any desired amount of silicon nitride. It is noted that the surface modification step (Step 1) tends to have a practical limit to the depth of modified nitride that can be generated with a single exposure of the silicon nitride layer to the hydrogen plasma. As such, sequential use of the surface modification and removal steps would typically be used to remove a predetermined or desired amount of the silicon nitride layer from the surface of the substrate.

In some embodiments, the dry etch process 100 shown in FIGS. 1 and 2 may be include additional process step(s) before and/or after the surface modification step (Step 1) and/or the removal step (Step 2). For example, purge steps may be performed between the surface modification step (Step 1) and/or the removal step (Step 2) to remove process gases from the processing space of the plasma processing chamber. Other variations can also be implemented while still taking advantage of the techniques described herein.

A wide variety of plasma process systems, parameters and process conditions may be utilized to provide selective etching of silicon nitride layers over oxide layers formed on a substrate in accordance with the techniques described herein. For example, plasma processing equipment (such as, e.g., a CCP or ICP processing system) can be used that allows plasma processing gases to be injected into a processing chamber and ignited. The plasma processing equipment may also allow a selected gas pressure (P) to be applied within the processing chamber, a selected temperature (T) to be applied to the substrate, a selected radio frequency (RF) energy to be applied to the processing chamber, and a duration of the plasma processing steps to be controlled.

A wide variety of processing gases can be utilized to generate the hydrogen plasma used in Step 1 and the halogen plasma used in Step 2 under a wide variety of process conditions. For example, the hydrogen plasma may be generated by injecting one or more hydrogen containing gases, such as hydrogen ($H_2$), hydrogen bromide (HBr), methane ($CH_4$) or hydrogen sulfide ($H_2S$), into the process chamber. When generating a hydrogen plasma in accordance with the techniques described herein, the process chamber is maintained at a sufficient gas pressure (e.g., less than 1500 Torr) and substrate temperature (e.g., less than 0° C.) to vaporize the first reaction byproduct (e.g., $NH_3$) and freeze or crystallize the second reaction byproduct (e.g., $H_2O$) during the surface modification step (Step 1). As noted above, the halogen plasma may be generated by injecting one or more halogen-containing gases, such as hydrogen bromide (HBr), chlorine ($Cl_2$), difluoride ($F_2$), xenon difluoride (XeF2), tetrafluoromethane ($CF_4$), nitrogen trifluoride ($NF_3$) or sulfur hexafluoride ($SF_6$), into the process chamber. When generating the halogen plasma, the gas pressure within the process chamber and the substrate temperature are preferably set to a higher pressure and a lower temperature than the gas pressure and substrate temperature used to generate the hydrogen plasma step to keep the protective crystallized water layer 230 intact.

In one example embodiment, the following parameters set forth in the TABLE below may be used in the dry etch process 100 shown in FIGS. 1-2 to provide selective etching of silicon nitride layers over oxide layers in accordance with the techniques described herein. In the TABLE below, the gas pressure is expressed in Torr; the substrate temperature is expressed in degrees Celsius (° C.); the radio frequency (RF) energy is expressed in Watts (W); and the duration is expressed in seconds (sec). Although example process conditions are provided below for illustrative purposes, other variations and processing parameters may also be used while still taking advantage of the techniques described herein.

TABLE

EXAMPLE PLASMA PROCESS PARAMETERS

| Step | Gas | P | T | RF | Duration |
|---|---|---|---|---|---|
| Step 1 | $H_2$, Ar | 0.1-1500 | −150-20 | 10-1000 | 5-300 |
| Step 2 | HBr | 0.1-1500 | −150-20 | 10-1000 | 5-180 |

As shown in the TABLE above, the hydrogen plasma used in Step 1 may be generated, in one embodiment, by supplying hydrogen ($H_2$) and argon (Ar) gases to a process chamber maintained at a gas pressure range between 0.01-1500 Torr and a substrate temperature range −150° C.-−20° C. In some embodiments, the gas pressure may range between 0.01-100 Torr and a substrate temperature range −80° C.-0° C., as noted further herein. While supplying the process gases to the process chamber, RF energy between 10 W-1000 W may be supplied to one or more electrodes to ignite the process gases and generate the hydrogen plasma within the process chamber. A substrate disposed within the process chamber may be exposed to the hydrogen plasma for approximately 5-300 seconds to perform the surface modification step (Step 1) shown in FIGS. 1 and 2. Although one example hydrogen-containing gas (e.g., $H_2$) is illustrated in Table 1, other hydrogen-containing gases and/or inert gases may also be supplied to the process chamber to generate the hydrogen plasma used in Step 1.

As shown in the TABLE above, the halogen plasma used in Step 2 may be generated, in one embodiment, by supplying hydrogen bromide (HBr) gas to a process chamber maintained at a gas pressure range between 0.01-1500 Torr and a substrate temperature range −150° C.-−20° C. Although a similar range of gas pressure and temperature is provided for generating the hydrogen plasma and the halogen plasma, a higher gas pressure and a lower substrate temperature may be selected from the range provided above to generate the halogen. While supplying the process gases to the process chamber, RF energy between 10 W-1000 W may be supplied to one or more electrodes to ignite the process gases and generate the halogen plasma within the process chamber. A substrate disposed within the process chamber may be exposed to the halogen plasma for approximately 5-180 seconds to perform the removal step (Step 2) shown in FIGS. 1 and 2. Although one example halogen-containing gas (e.g., HBr) is illustrated in Table 1, other halogen-containing gases and/or inert gases may also be supplied to the process chamber to generate the halogen plasma used in Step 2.

Figure 3:
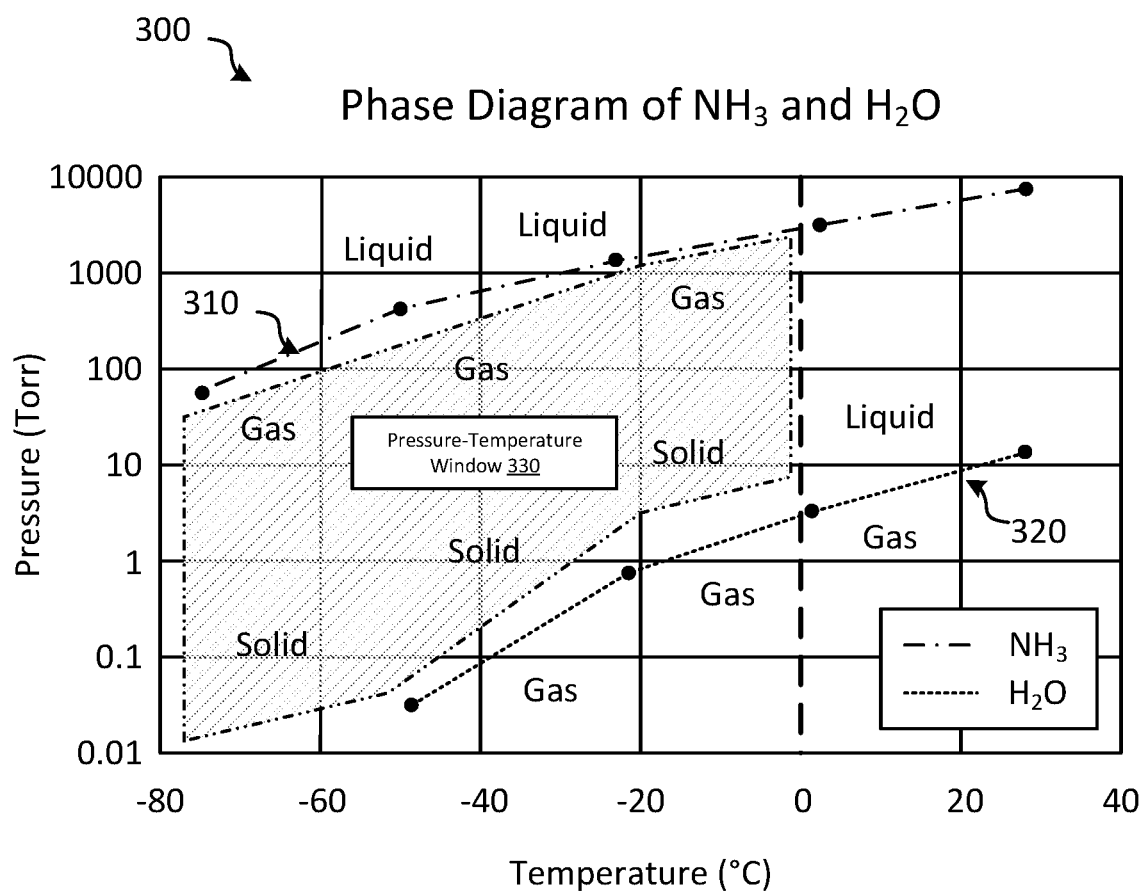
FIG. 3 is a phase diagram for ammonia ($NH_3$) and water ($H_2O$) illustrating a pressure-temperature window, which may be used in the cyclic, two-step dry etch process described herein to select appropriate pressure and temperature conditions.

The dry etch process 100 shown in FIGS. 1 and 2 improves dry etch selectivity of silicon nitride to oxide, and prevents oxide layers from etching, by leveraging the different volatilities of reaction byproducts (e.g., $NH_3$ and $H_2O$) produced during the surface modification step (Step 1). FIG. 3 provides a phase diagram 300 for ammonia ($NH_3$) and water ($H_2O$) at various gas pressures (Torr) and substrate temperatures (° C.). As shown in the phase diagram 300, ammonia ($NH_3$) is vaporized into a gas at gas pressures and substrate temperatures below phase curve 310, and is condensed into a liquid at gas pressures and substrate temperatures above phase curve 310. Likewise, water ($H_2O$) is vaporized into a gas at gas pressures and substrate temperatures below phase curve 320, condensed into a liquid at gas pressures above phase curve 320 and substrate temperatures above 0° C., and frozen (or crystallized) into a solid at gas pressures above phase curve 320 and substrate temperatures below 0° C.

By selecting appropriate pressure and temperature conditions within the pressure-temperature window 330, the dry etch process 100 shown in FIGS. 1 and 2 takes advantage of the different volatilities of ammonia ($NH_3$) and water ($H_2O$) to ensure that $NH_3$ is vaporized from the exposed SiN surfaces and $H_2O$ is crystallized on the exposed oxide surfaces during the surface modification step (Step 1). Whereas $NH_3$ vaporization forms a modified surface layer (e.g., a Si layer) on the exposed SiN surfaces, which is easily removed by the halogen plasma during the removal step (Step 2), the crystallized water layer formed on the exposed oxide surfaces during the surface modification step (Step 1) protects the underlying oxide layer from etching and improves etch selectivity during the subsequently performed removal step (Step 2).

Figure 4:
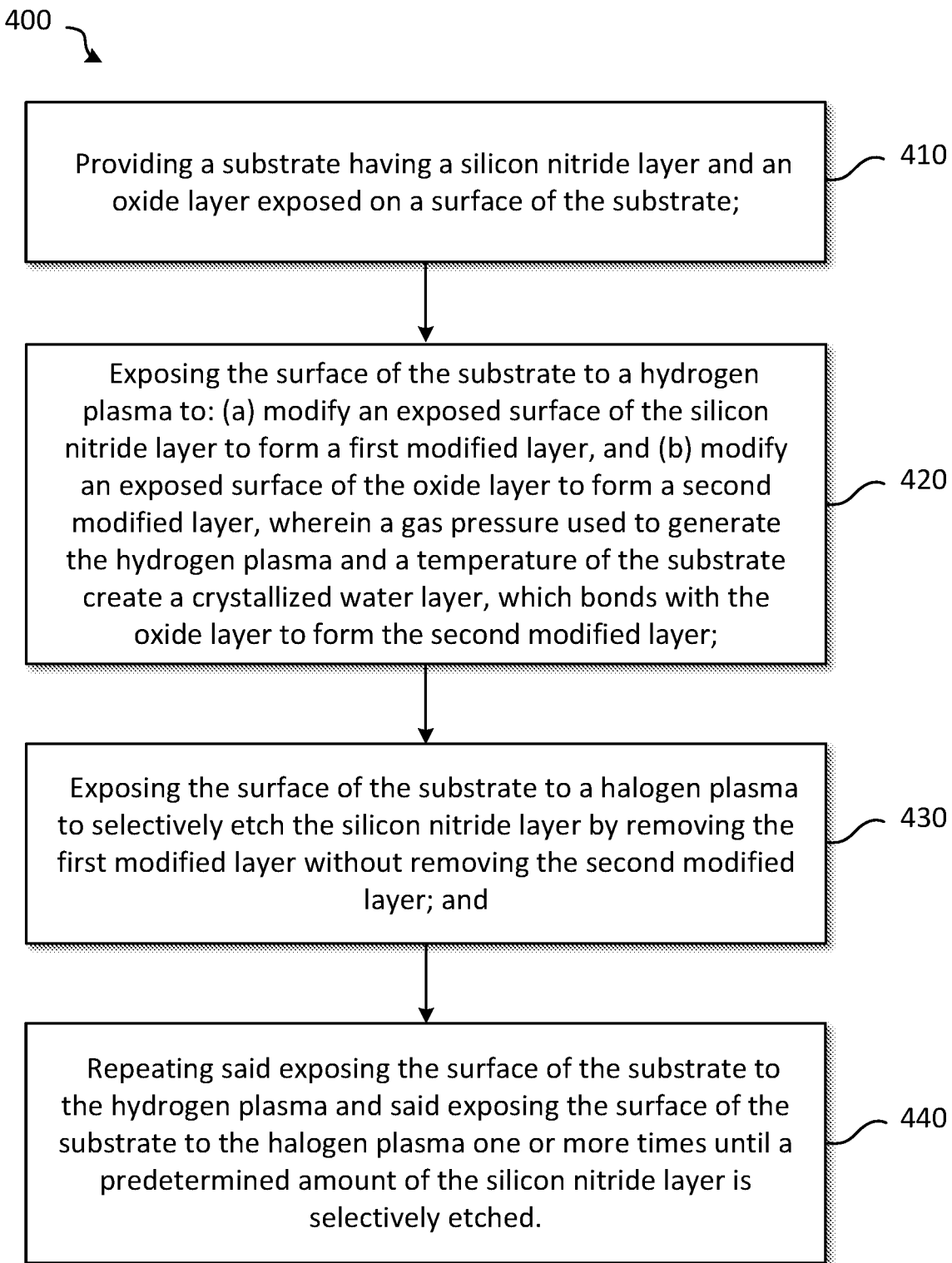
FIG. 4 is a flow chart diagram illustrating one embodiment of a method that utilizes the techniques described herein to selectively etch silicon nitride over oxide.
Figure 5:
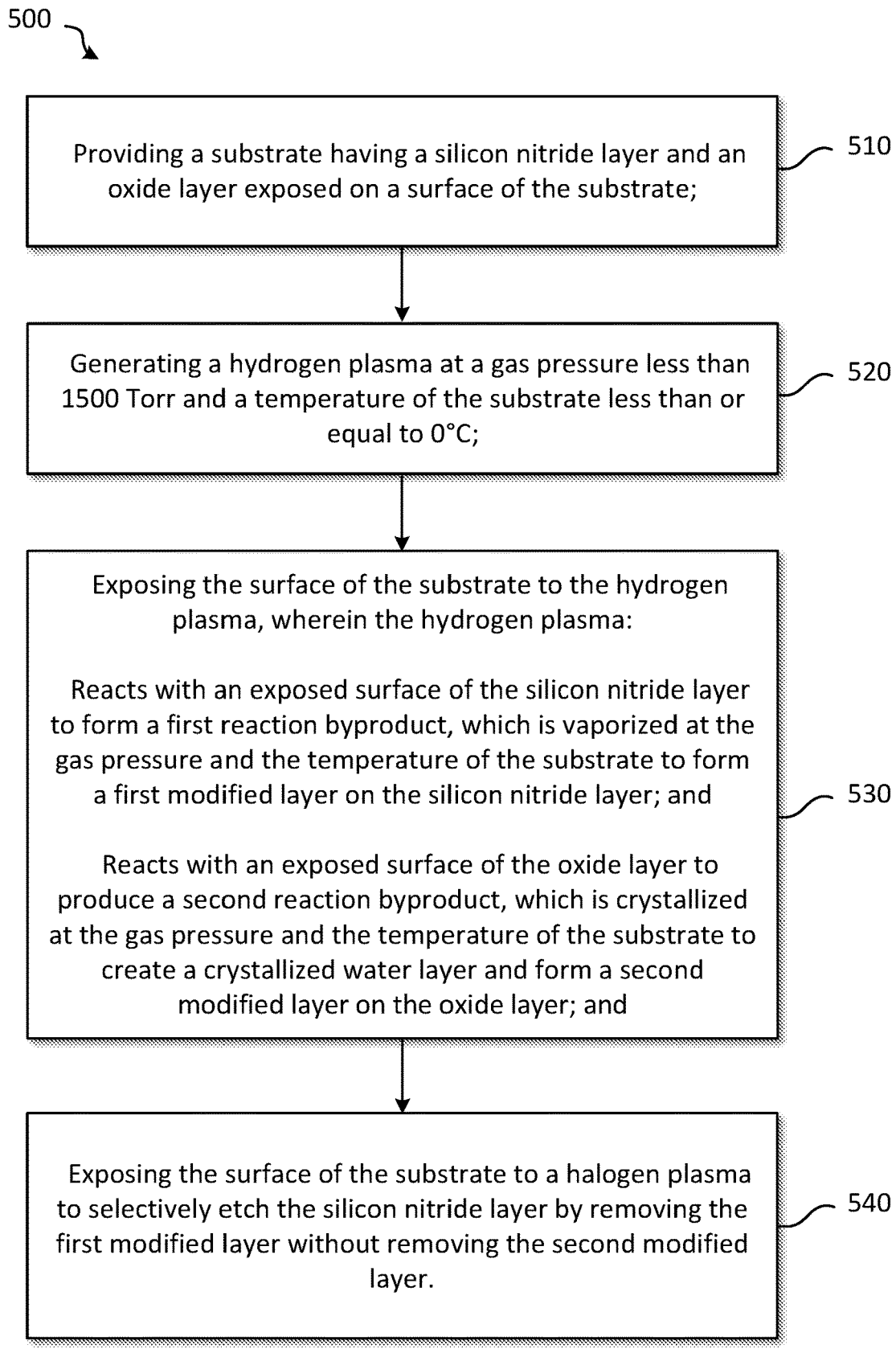
FIG. 5 is a flow chart diagram illustrating another embodiment of a method that utilizes the techniques described herein to selectively etch silicon nitride over oxide.

FIGS. 4 and 5 illustrate embodiments of exemplary methods that utilize the techniques described herein to provide selective etching of silicon nitride layers over oxide layers formed on a substrate. It will be recognized that the embodiments shown in FIGS. 4 and 5 are merely exemplary and additional methods may utilize the techniques described herein. Further, additional processing steps may be added to the method shown in FIGS. 4 and 5 as the steps described are not intended to be exclusive. Moreover, the order of the steps is not limited to the order shown in the figure as different orders may occur and/or various steps may be performed in combination or at the same time.

FIG. 4 illustrates one embodiment of a method 400 that utilizes the techniques described herein to provide selective etching of silicon nitride layers over oxide layers formed on a substrate. As shown in FIG. 4, the method 400 may include providing a substrate having a silicon nitride layer and an oxide layer exposed on a surface of the substrate (in step 410) and exposing the surface of the substrate to a hydrogen plasma (in step 420) to: (a) modify an exposed surface of the silicon nitride layer to form a first modified layer, and (b) modify an exposed surface of the oxide layer to form a second modified layer, wherein a gas pressure used to generate the hydrogen plasma and a temperature of the substrate create a crystallized water layer, which bonds with the oxide layer to form the second modified layer. The method 400 may further include exposing the surface of the substrate to a halogen plasma to selectively etch the silicon nitride layer by removing the first modified layer without removing the second modified layer (in step 430), and repeating said exposing the surface of the substrate to the hydrogen plasma and said exposing the surface of the substrate to the halogen plasma one or more times until a predetermined amount of the silicon nitride layer is selectively etched (in step 440).

FIG. 5 illustrates another embodiment of a method 500 that utilizes the techniques described herein to provide selective etching of silicon nitride layers over oxide layers formed on a substrate. As shown in FIG. 5, the method 500 may begin by providing a substrate having a silicon nitride layer and an oxide layer exposed on a surface of the substrate (in step 510). Next, the method 500 may include generating a hydrogen plasma at a gas pressure less than 1500 Torr and a temperature of the substrate less than or equal to 0° C. (in step 520) and exposing the surface of the substrate to the hydrogen plasma (in step 530). In step 530, the hydrogen plasma: (a) reacts with an exposed surface of the silicon nitride layer to form a first reaction byproduct, which is vaporized at the gas pressure and the temperature of the substrate to form a first modified layer on the silicon nitride layer, and (b) reacts with an exposed surface of the oxide layer to produce a second reaction byproduct, which freezes at the gas pressure and the temperature of the substrate to create a crystallized water layer and form a second modified layer on the oxide layer. After exposing the surface of the substrate to the hydrogen plasma (in step 530), the method 500 may further include exposing the surface of the substrate to a halogen plasma (in step 540) to selectively etch the silicon nitride layer by removing the first modified layer without removing the second modified layer. In some embodiments, the method 500 may further include repeating said exposing the surface of the substrate to the hydrogen plasma (in step 530) and said exposing the surface of the substrate to the halogen plasma (in step 540) a number of cycles to selectively etch a predetermined amount of the silicon nitride layer.

The methods 400 and 500 shown in FIGS. 4 and 5 provide various examples of improved methods that may be used to selectively etch silicon nitride over oxide. The methods 400, 500 improve selectivity of silicon nitride over oxide by creating a crystallized water layer on the oxide layer during the surface modification step (i.e., in steps 420 and 530) used to form the first modified layer and the second modified layer. When the surface of the substrate is subsequently exposed to the halogen plasma during the removal step (i.e., in steps 430 and 540), the crystallized water layer prevents reactive species of the halogen plasma from reaching the second modified layer to reduce etching of the oxide layer.

Like the dry etch process 100 shown in FIGS. 1 and 2, the methods 400, 500 shown in FIGS. 4 and 5 improve dry etch selectivity of silicon nitride to oxide, and prevent the oxide layer from etching, by leveraging the different volatilities of reaction byproducts produced during the surface modification step (i.e., in steps 420 and 530). For example, when the surface of the substrate is exposed to the hydrogen plasma (in steps 420 and 530), the hydrogen plasma reacts with the exposed surface of the silicon nitride layer to form a first reaction byproduct (e.g., ammonia, $NH_3$), which is vaporized at the gas pressure and the temperature of the substrate to form the first modified layer (e.g., a silicon layer) on the silicon nitride layer. The hydrogen plasma also reacts with the exposed surface of the oxide layer to produce a second reaction byproduct (e.g., water, $H_2O$), which freezes at the gas pressure and the temperature of the substrate to create the crystallized water layer on the oxide layer and form the second modified layer (e.g., a silicon dioxide layer) on the oxide layer.

The gas pressure used to generate the hydrogen plasma and the temperature of the substrate are selected from a pressure-temperature window, which: (a) vaporizes the ammonia ($NH_3$) from the exposed surface of the silicon nitride layer to form the silicon layer, and (b) freezes the water ($H_2O$) condensed on the exposed surface of the oxide layer to create the crystallized water layer, which bonds with the exposed surface of the oxide layer to form the silicon dioxide layer. In some embodiments, the gas pressure used to generate the hydrogen plasma and the temperature of the substrate may be selected from a pressure-temperature window that includes a pressure range between 10 mTorr and 1500 Torr and a temperature range between 20° C. and −150° C. In other embodiments, the gas pressure used to generate the hydrogen plasma and the temperature of the substrate may be selected from a pressure-temperature window that includes a pressure range between 10 mTorr and 100 Torr and a temperature range between 0° C. and −80° C.

In some embodiments, the methods 400, 500 may further reduce (or eliminate) etching of the oxide layer by selecting the appropriate process gas(es) used to selectively etch the silicon nitride layer in steps 430 and 540. As noted above, the first modified layer may be a silicon layer and the second modified layer may be a silicon dioxide layer. In such an embodiment, the reactive species of the halogen plasma may be chosen to selectively etch silicon over silicon dioxide to further reduce or eliminate etching of the oxide layer. Examples of processing gases that may be used to selectively etch silicon over silicon dioxide include halogen-containing gases, such as but are not limited to, chlorine ($Cl_2$), hydrogen bromide (HBr), difluoride ($F_2$) and xenon difluoride (XeF2). Other halogen-containing gases, which have an etch selectivity of silicon to silicon dioxide of 5:1 or greater, may also be used to generate the halogen plasma. For example, tetrafluoromethane ($CF_4$), nitrogen trifluoride ($NF_3$) or sulfur hexafluoride ($SF_6$) could also be used to generate the halogen plasma.

Improved processes and methods are described above for selectively etching silicon nitride layers over oxide layers formed on a substrate. It is noted that one or more deposition processes can be used to form the silicon nitride and oxide layers described herein as is well known to those skilled in the art. For example, one or more depositions can be implemented using chemical vapor deposition (CVD), plasma enhanced CVD (PECVD), physical vapor deposition (PVD), atomic layer deposition (ALD), and/or other deposition processes utilizing any of a wide-ranging deposition. Lithography processes with respect to PR layers can be implemented using optical lithography, extreme ultra-violet (EUV) lithography, and/or other lithography processes. The etch processes utilized to selectively etch silicon nitride over oxide can be implemented using plasma etch processes, discharge etch processes, and/or other desired etch processes. For example, plasma etch processes can be implemented using hydrogen-containing gases and halogen-containing gases in combination with one or more dilution gases (e.g., argon, nitrogen, etc.), though other techniques may be utilized. In addition, operating variables for process steps can be controlled to ensure that desired etch parameters are achieved. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

As noted above, the improved processes and methods described above may be performed using a wide variety of plasma processing systems. One embodiment of an example plasma processing system 600 is described with respect to FIG. 6. It is noted, however, that the techniques described herein may be utilized with a wide range of plasma processing systems, and the plasma processing system 600 is simply one example embodiment.

Figure 6:
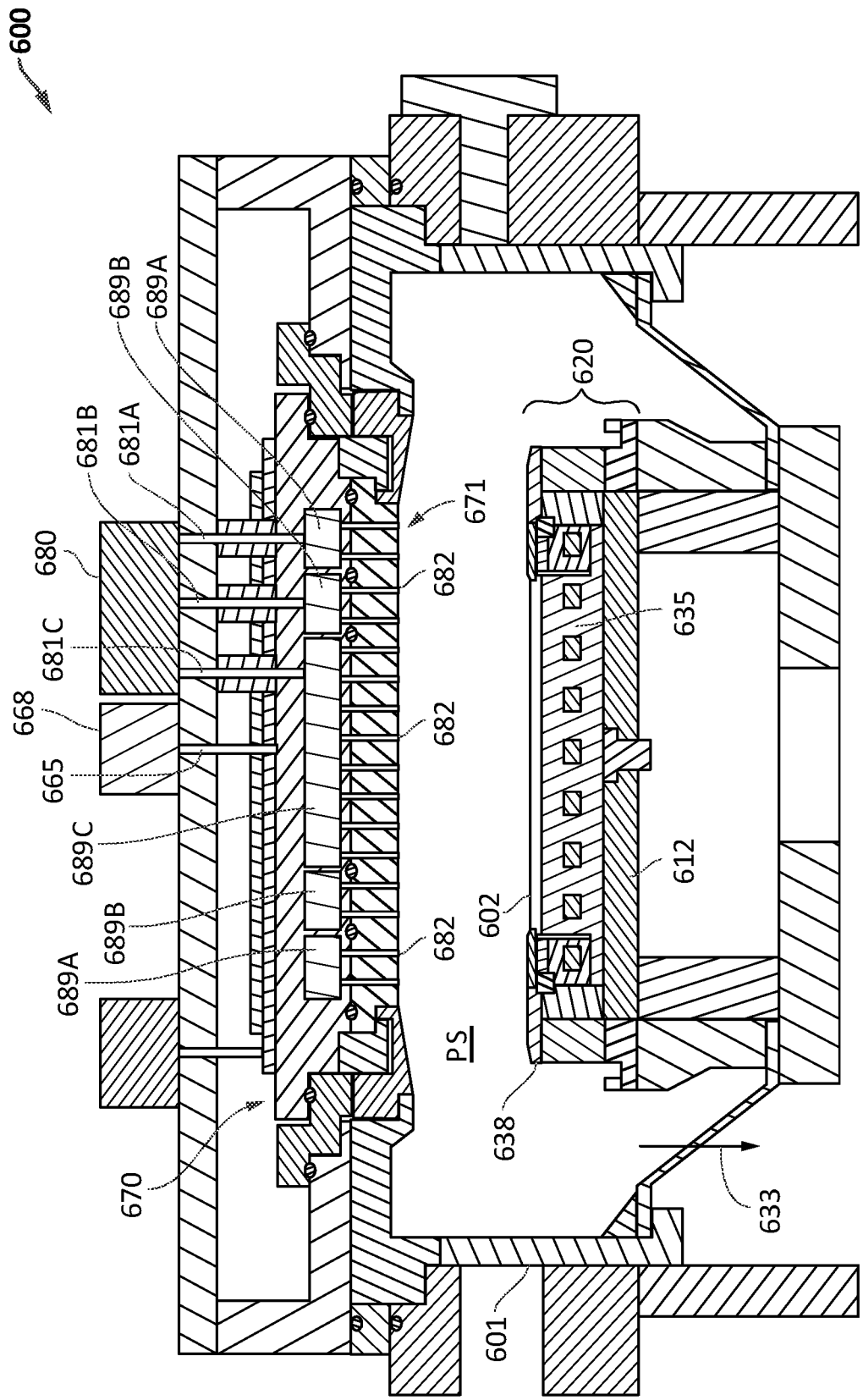
FIG. 6 is a block diagram illustrating one embodiment of a plasma processing apparatus that can be used as an etch chamber for the embodiments described herein.

FIG. 6 provides a block diagram of an example plasma processing system 600 that can be used as an etch chamber for the embodiments described herein. More specifically, FIG. 6 provides a schematic cross-sectional view of a capacitively coupled plasma (CCP) processing system 600 that includes a process space (PS), or process chamber, for receiving and processing semiconductor substrates. Although a CCP processing system 600 is shown in FIG. 6, alternative plasma processing systems may also be utilized, including for example, but not limited to, inductively coupled plasma (ICP) processing systems, microwave plasma processing systems, and the like. A CCP processing system may be particularly well suited for practicing the techniques described herein as the electrode spacing of such a system allows for beneficial control of gases to a localized region of the plasma space, thus providing localized plasma processing on the substrate.

The plasma processing system 600 can be used for multiple operations including ashing, etching, deposition, cleaning, plasma polymerization, plasma-enhanced chemical vapor deposition (PECVD), atomic layer deposition (ALD), and so forth. The structure of the CCP processing system 600 is well known, and the particular structure provided herein is merely exemplary. For example, plasma processing can be executed within processing chamber 601, which can be a vacuum chamber made of a metal such as aluminum or stainless steel. The processing chamber 601 defines a processing vessel providing a process space (PS) for plasma generation. An inner wall of the processing vessel can be coated with alumina, yttria, or another protectant. The processing vessel can be cylindrical in shape or have other geometric configurations.

At a lower, central area within the processing chamber 601, a susceptor 612 (which can be disc-shaped) can serve as a mounting table on which, for example, a substrate 602 to be processed (such as a semiconductor wafer) can be mounted. Substrate 602 can be moved into the processing chamber 601 through a loading/unloading port and gate valve. Susceptor 612 forms part of a lower electrode assembly 620 as an example of a second electrode acting as a mounting table for mounting substrate 602 thereon. The susceptor 612 can be formed of, e.g., an aluminum alloy. Susceptor 612 is provided thereon with an electrostatic chuck (as part of the lower electrode assembly) for holding the substrate 602. The electrostatic chuck is provided with an electrode 635. Electrode 635 is electrically connected to a direct current (DC) power source (not shown). The electrostatic chuck attracts the substrate 602 thereto via an electrostatic force generated when DC voltage from the DC power source is applied to the electrode 635. The susceptor 612 can be electrically connected to a high-frequency power source via a matching unit. For other embodiments and processing chambers, two or more power sources can be used and connected to electrode 635 and/or other electrodes within the processing chamber. This high-frequency power source (a second power source) can output a high-frequency voltage in a range from, for example, 2 MHz (megahertz) to 20 MHz. Applying high frequency bias power causes ions, in plasma generated within the processing chamber 601, to be attracted to substrate 602. A focus ring assembly 638 is provided on an upper surface of the susceptor 612 to surround the electrostatic chuck.

An exhaust path 633 can be formed through one or more exhaust ports (not shown) which connect to a gas exhaust unit. The gas exhaust unit can include a vacuum pump such as a turbo molecular pump configured to pump out the plasma processing space within the processing chamber 601 to a desired vacuum condition. The gas exhaust unit evacuates the inside of the processing chamber 601 thereby depressurizing the inner pressure thereof down to the desired degree of vacuum.

An upper electrode assembly 670 is an example of a first electrode and is positioned vertically above the lower electrode assembly 620 to face the lower electrode assembly 620 in parallel. The plasma generation space, or process space (PS), is defined between the lower electrode assembly 620 and the upper electrode assembly 670. The upper electrode assembly 670 includes an inner upper electrode 671, having a disk shape, and an outer upper electrode which may be annular and surrounding a periphery of the inner upper electrode 671. The inner upper electrode 671 also functions as a processing gas inlet for injecting a specific amount of processing gas into the process space (PS) above substrate 602 mounted on the lower electrode assembly 620. The upper electrode assembly 670 thereby forms a showerhead. More specifically, the inner upper electrode 671 includes gas injection openings 682.

The upper electrode assembly 670 may include one or more buffer chamber(s) 689A, 689B, and 689C. The buffer chambers are used for diffusing process gas and can define a disk-shaped space. Processing gas from a process gas supply system 680 supplies gas to the upper electrode assembly 670. The process gas supply system 680 can be configured to supply a processing gas for performing specific processes, such as film-forming, etching, and the like, on the substrate 602. The process gas supply system 680 is connected to gas supply lines 681A, 681B, and 681C forming a processing gas supply path. The gas supply lines are connected to the buffer chambers of the inner upper electrode 671. The processing gas can then move from the buffer chambers to the gas injection openings 682 at a lower surface thereof. A flow rate of processing gas introduced into the buffer chambers 689A-C can be adjusted, e.g., by using a mass flow controller. Further, the processing gas introduced is discharged from the gas injection openings 682 of the electrode plate (showerhead electrode) to the process space (PS). The inner upper electrode 671 functions in part to provide a showerhead electrode assembly.

As shown in FIG. 6, three buffer chambers 689A, 689B, and 689C are provided corresponding to edge buffer chamber 689A, middle buffer chamber 689B, and center buffer chamber 689C. Similarly, gas supply lines 681A, 681B, and 681C may be configured as edge gas supply line 681A, middle gas supply line 681B and center gas supply line 681C. The buffer chambers are provided in a manner corresponding to different localized regions of the substrate in this case edge, middle and center. As will be discussed more below, these regions may correspond to specific process plasma process conditions for localized regions of the substrate 602. It will be recognized that the use of three localized regions is merely exemplary. Thus, the plasma processing apparatus may be configured to provided localize plasma process conditions on any number of regions of the substrate. It is further again noted that any of a variety of configurations may be utilized, and the techniques described herein are not limited to the manner in which the process gas supply system 680 is configured to split the gas flows to the various buffer chambers.

The upper electrode assembly 670 is electrically connected with a high-frequency power source (not shown) (first high-frequency power source) via a power feeder 665 and a matching unit 668. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 602 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of selectively etching silicon nitride over oxide, comprising:
    providing a substrate having a silicon nitride layer and an oxide layer exposed on a surface of the substrate;
    exposing the surface of the substrate to a hydrogen plasma to: (a) modify an exposed surface of the silicon nitride layer to form a first modified layer, and (b) modify an exposed surface of the oxide layer to form a second modified layer, wherein a gas pressure used to generate the hydrogen plasma and a temperature of the substrate create a crystallized water layer, which bonds with the exposed surface of the oxide layer to form the second modified layer between the crystallized water layer and an unmodified portion of the oxide layer underlying the second modified layer;
    exposing the surface of the substrate to a halogen plasma to selectively etch the silicon nitride layer over the oxide layer by removing the first modified layer without removing the second modified layer, wherein during said exposing the surface of the substrate to the halogen plasma, the crystallized water layer reduces etching of the oxide layer by preventing reactive species of the halogen plasma from reaching the second modified layer; and
    repeating said exposing the surface of the substrate to the hydrogen plasma and said exposing the surface of the substrate to the halogen plasma one or more times until a predetermined amount of the silicon nitride layer is selectively etched.

2. The method of claim 1, wherein the first modified layer is a silicon layer, wherein the second modified layer is a silicon dioxide layer, and wherein the reactive species of the halogen plasma selectively etch silicon over silicon dioxide to further reduce or eliminate etching of the oxide layer.

3. The method of claim 1, wherein the gas pressure ranges between 10 mTorr and 1500 Torr and the temperature of the substrate ranges between 0° C. and −80° C.

4. The method of claim 1, wherein during said exposing the surface of the substrate to the hydrogen plasma, the hydrogen plasma reacts with the exposed surface of the silicon nitride layer to form a first reaction byproduct, which is vaporized at the gas pressure and the temperature of the substrate to form the first modified layer.

5. The method of claim 4, wherein the first reaction byproduct is ammonia ($NH_3$), and wherein the first modified layer is a silicon layer.

6. The method of claim 1, wherein during said exposing the surface of the substrate to the hydrogen plasma, the hydrogen plasma reacts with the exposed surface of the oxide layer to produce a second reaction byproduct, which freezes at the gas pressure and the temperature of the substrate to create the crystallized water layer on the exposed surface of the oxide layer and form the second modified layer.

7. The method of claim 6, wherein the second reaction byproduct is water ($H_2O$), and wherein the second modified layer is a silicon dioxide layer.

8. The method of claim 1, wherein the first modified layer is a silicon layer, wherein the second modified layer is a silicon dioxide layer, and wherein the method further comprises generating the halogen plasma from one or more process gases, which have an etch selectivity of silicon to silicon dioxide of 5:1 or greater.

9. The method of claim 8, wherein the one or more processing gases comprise one or more of chlorine ($Cl_2$), hydrogen bromide (HBr), difluoride ($F_2$), xenon difluoride (XeF2), tetrafluoromethane ($CF_4$), nitrogen trifluoride ($NF_3$) and sulfur hexafluoride ($SF_6$).

10. A method of selectively etching silicon nitride over oxide, comprising:
    providing a substrate having a silicon nitride layer and an oxide layer exposed on a surface of the substrate;
    generating a hydrogen plasma at a gas pressure less than 1500 Torr and a temperature of the substrate less than or equal to 0° C.;
    exposing the surface of the substrate to the hydrogen plasma, wherein the hydrogen plasma:
        reacts with an exposed surface of the silicon nitride layer to form a first reaction byproduct, which is vaporized at the gas pressure and the temperature of the substrate to form a first modified layer on the silicon nitride layer; and
        reacts with an exposed surface of the oxide layer to produce a second reaction byproduct, which freezes at the gas pressure and the temperature of the substrate to create a crystallized water layer and form a second modified layer on the oxide layer; and
    exposing the surface of the substrate to a halogen plasma to selectively etch the silicon nitride layer by removing the first modified layer without removing the second modified layer.

11. The method of claim 10, further comprising repeating said exposing the surface of the substrate to the hydrogen plasma and said exposing the surface of the substrate to the halogen plasma a number of cycles to selectively etch a predetermined amount of the silicon nitride layer.

12. The method of claim 10, wherein the gas pressure ranges between 10 mTorr and 1500 Torr and the temperature of the substrate ranges between 0° C. and −80° C.

13. The method of claim 10, wherein during said exposing the surface of the substrate to the halogen plasma, the crystallized water layer reduces etching of the oxide layer by preventing reactive species of the halogen plasma from reaching the second modified layer.

14. The method of claim 13, wherein the first modified layer is a silicon layer, wherein the second modified layer is a silicon dioxide layer, and wherein the reactive species of the halogen plasma selectively etch silicon over silicon dioxide to further reduce or eliminate etching of the oxide layer.

15. The method of claim 10, wherein the halogen plasma is generated from one or more process gases, which have an etch selectivity of silicon to silicon dioxide of 5:1 or greater.

16. The method of claim 10, wherein the hydrogen plasma is generated from one or more process gases comprising hydrogen ($H_2$), hydrogen bromide (HBr), methane ($CH_4$) and hydrogen sulfide ($H_2S$), and wherein the halogen plasma is generated from one or more process gases comprising chlorine ($Cl_2$), hydrogen bromide (HBr), difluoride ($F_2$), xenon difluoride (XeF2), tetrafluoromethane ($CF_4$), nitrogen trifluoride ($NF_3$) and sulfur hexafluoride ($SF_6$).

17. The method of claim 10, wherein the first reaction byproduct is ammonia ($NH_3$) and the first modified layer is a silicon layer, and wherein the second reaction byproduct is water ($H_2O$) and the second modified layer is a silicon dioxide layer.

18. The method of claim 17, wherein when the surface of the substrate is exposed to the hydrogen plasma, the gas pressure used to generate the hydrogen plasma and the temperature of the substrate:
    vaporize the ammonia ($NH_3$) from the exposed surface of the silicon nitride layer to form the silicon layer; and
    freeze the water ($H_2O$) on the exposed surface of the oxide layer to create the crystallized water layer, which bonds with the exposed surface of the oxide layer to form the silicon dioxide layer.

19. The method of claim 18, wherein the gas pressure used to generate the hydrogen plasma and the temperature of the substrate is selected from a pressure-temperature window comprising a pressure range between 10 mTorr and 1500 Torr and a temperature range between 0° C. and −80° C.

* * * * *